United States Patent [19]

Conta

[11] 4,393,591
[45] Jul. 19, 1983

[54] OPTICAL TRANSDUCER
[75] Inventor: Renato Conta, Ivrea, Italy
[73] Assignee: Ing. C. Olivetti & C., S.p.A., Italy
[21] Appl. No.: 320,875
[22] Filed: Nov. 13, 1981
[30] Foreign Application Priority Data
Nov. 17, 1980 [IT] Italy .............................. 68755 A/80
[51] Int. Cl.³ ...................... G01B 11/00; G01B 11/26
[52] U.S. Cl. .................................... 33/1 L; 33/1 PT; 33/125 A; 357/74
[58] Field of Search ......... 33/1 L, 1 N, 1 PT, 125 A, 33/125 C; 356/426; 250/211 R; 357/75, 74, 80

[56] References Cited
U.S. PATENT DOCUMENTS

| 2,944,157 | 7/1960 | McAuslan et al. | 33/1 PT |
| 4,040,092 | 8/1977 | Carnes | 250/211 R |
| 4,122,479 | 10/1978 | Sugawara et al. | 357/75 |
| 4,218,701 | 8/1980 | Shirasaki | 357/74 |

Primary Examiner—Willis Little
Attorney, Agent, or Firm—Schuyler, Banner, Birch, McKie & Beckett

[57] ABSTRACT

An optical transducer for determining the angular position of a rotating member relative to a fixed structure, comprises a notched disc 13 rotatable inside a support housing 12, a light emitter 18 and a plurality of photovoltaic cells 19 for detecting the passage of light through the disc notches. The active and passive elements of an electronic circuit connected to the photovoltaic cells are carried by a single ceramic plate 21, which also acts as a support for the cells 19. The circuit comprises trimming resistors in the form of films deposited on the ceramic plate and connected to the amplifiers by the photovoltaic cells. In order for the signals generated by the amplifiers to have constant, predetermined peak values, the values of the resistors are trimmed during the production stage by means of a laser which selectively burns away parts thereof. The ceramic plate 21 is cemented on to the transducer housing 12, which is then positioned on the laser apparatus. The operations involved in presetting the resistors is carried out with the transducer in operation, and the laser need only be focused and pre-positioned once for the entire circuit.

6 Claims, 6 Drawing Figures

OPTICAL TRANSDUCER

This invention relates to an optical transducer for determining the angular position of a rotating member relative to a fixed structure, for example the shaft of an electric motor relative to its stator.

The optical transducer comprising a disc which can be coupled to the rotating member and which is provided with a plurality of radial notches, a housing inside which the disc rotates, a light emitting element, a plurality of photovoltaic cells for detecting passage of light through the disc notches, and an electronic circuit connected to the photovoltaic cells to generate signals which indicate the position of the disc relative to the housing.

In a known transducer, four photocells are provided, connected to phase opposition to amplifiers in order to generate two signals which, in response to disc rotation, are substantially sinusoidal and mutually out of phase by 90°. The transducer also comprises two photocells used respectively to generate a stabilisation signal and a disc zero position signal. In order to optimise the circuit, the peak values of the various signals must be constant and predetermined. This is attained by providing in the electronic circuit a plurality of film resistors, the value of which is varied selectively while the transducer is in motion, with the aid of a laser which cuts away a part thereof by partially burning them. In this transducer, the circuit is of printed type, i.e. comprising an insulating plastics board which supports the circuit conductors on to which the active elements and part of the passive elements of the circuit are individually soldered. The regulating resistors for the photocells are mounted on independent ceramic supports. Because of the poor accuracy with which these supports can be soldered, the operation involved in presetting the resistors by means of the laser requires successive adjustments in the positioning and focusing of the laser beam, which makes this operation long, costly and not susceptible to automation.

A first object of the present invention is to provide a reliable transducer of low cost, in which the operation involved in presetting the components by means of the laser apparatus is simple and short, so obviating the drawbacks of the known transducer.

In accordance with this first object, the transducer of the invention is defined in claim 1 below.

According to another aspect of the invention, the transducer is as defined in claim 2 below.

The invention will be described in more detail, by way of example, with reference to the accompanying drawings, in which.

Figure 2:
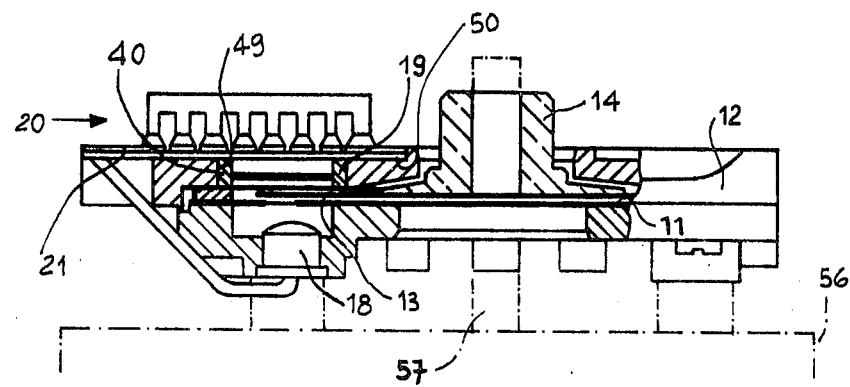
FIG. 2 is a partly sectional side view of the transducer of FIG. 1.
Figure 1:
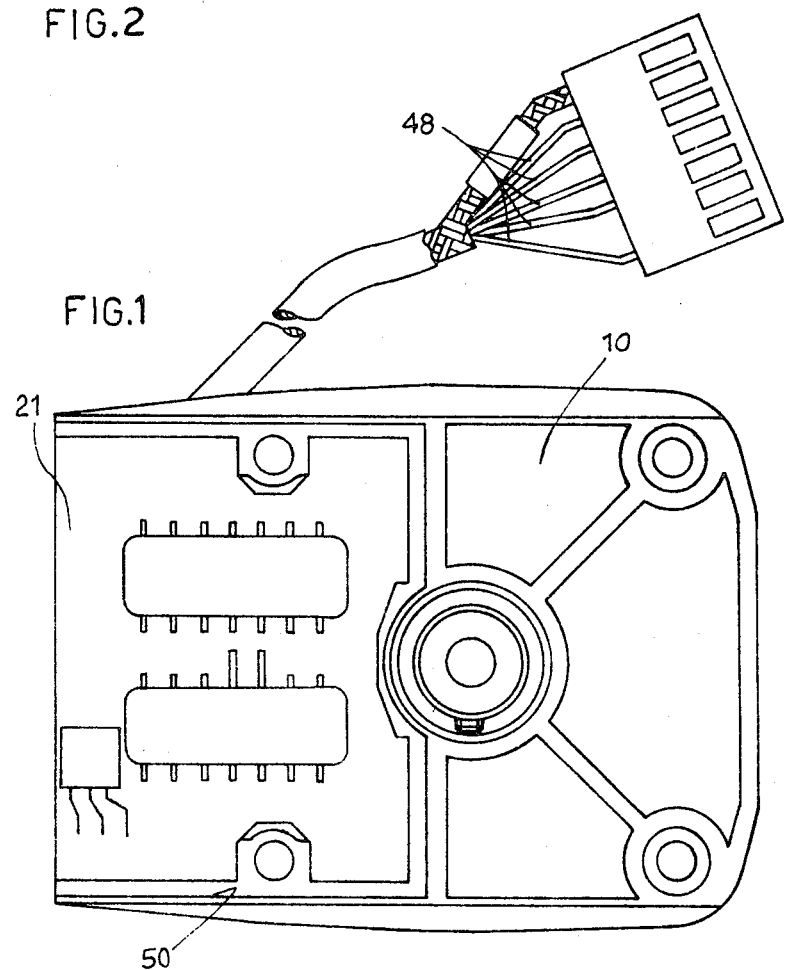
FIG. 1 is a front view of an optical transducer embodying the invention.

With reference to FIG. 1, the optical transducer 10 comprises a plastics housing 12 with a cavity 11 (FIG. 2) in which there is mounted a disc 13, which is provided with a plurality of equidistant peripheral radial notches and is fixed to a hub 14 arranged to be mounted on the rotating member of which the angular position is to be determined. These elements are described in greater detail in our British Patent Application No. 8,030,332 published under Ser. No. 2,062,220.

Figure 4:
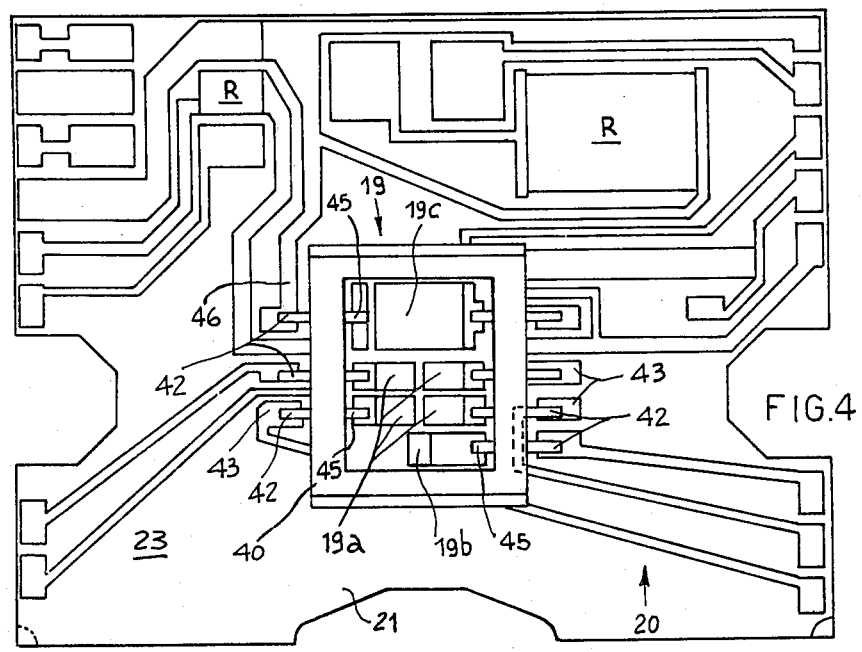
FIG. 4 is a view of the rear of the detail of FIG. 3.

On the housing 12 in positions corresponding with the notches 16 there are fitted a light emitter 18, and, on the other side with respect to the disc 13, a group of six photovoltaic cells 19 (FIGS. 2 and 4) described in Italian Patent Application No. 69951-A/77 filed by the applicant on Dec. 30, 1977, and which briefly comprises four cells 19a, which, with a mutual phase difference of 90°, detect the light passing through the disc notches, a cell 19b which receives light from a single disc notch, and a cell 19c which directly receives light from the illuminator 18. An electronic circuit 20 processes the output signal from the cells 19a in order to provide in known manner two periodic signals out of phase by 90° which indicate the angular position of the disc 13. In response to the signals provided by the photocells 19b and 19c, the circuit 20 provides a disc rotation signal and a stabilisation signal for the periodic position signals.

The support for the circuit 20 is a ceramic plate 21 (FIGS. 3, 4 and 5) which comprises two flat parallel surfaces 22 and 23, on which the conductors with their respective terminals and resistive elements R are deposited, for example by the thick film method. In addition, two integrated circuits 31 and 32 have their pins soldered to corresponding terminals 33, 34 respectively of the circuit 20, to perform the amplifying functions for the output signals from the cells 19. Further circuit elements such as capacitors, transistors and diodes, also soldered to the circuit, have not been indicated on the drawings for simplicity. Before soldering the external components, the resistors R are preset to the design values by suitable partial cuts (passive trimming) carried out by means of a laser, using known methods.

Some of the resistors R, indicated by 24, 25, 26, 27, 28 and 29, are connected to the six cells 19, and their value determines the level of the output signal from the amplifiers, to which the resistors 24 to 29 are connected. In order to obtain symmetrical position and rotation signals with equal predetermined peak values, the various resistors are subjected to partial cutting (functional trimming) with the transducer in operation, in order to modify their value until the desired output signals are obtained.

Figure 5:
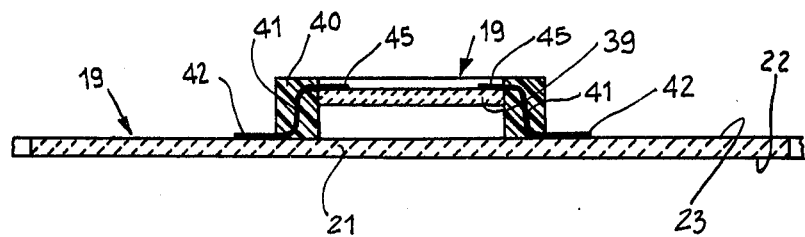
FIG. 5 is a section on the line V—V of FIG. 4.

The photovoltaic cells 19 are supported by the ceramic plate 21 on the second surface 23 thereof, their conductors being connected to the conductors of the surface 21 by through connections. More specifically, the cells 19 are integrated into a silicon substrate 39 which is preassembled in a plastics support frame 40 (FIG. 5). The frame 40 incorporates seven step-shaped metal foils 41, each having a lower terminal 42 external to the frame 40, and which (FIG. 4) is arranged to be welded on to a corresponding terminal 43 of a part of the circuit 20 provided on the surface 23 of the plate 21. The coils 41 have one internal upper terminal 45 connected to the cells 19 in such a manner that one of the foils, soldered to an earth conductor 46, is soldered to a common pole of the photocells 19, and the other six terminals 45 are soldered to the six corresponding cells 19a, 19b and 19c.

After soldering, the photocells 19 are mounted so that they project from the plate 21. During assembly, the output conductors 48 are soldered to the plate 21, and the frame is fitted accurately into a complementary compartment 49 in the housing 12, which prevents infiltration of external light on to the photocells 19, and ensures correct positioning of the photocells relative to the other parts of the transducer. At the same time, the plate 21 is inserted into a corresponding cavity 50 in the transducer housing 12, to which it is fixed for example by cementing.

Figure 6:
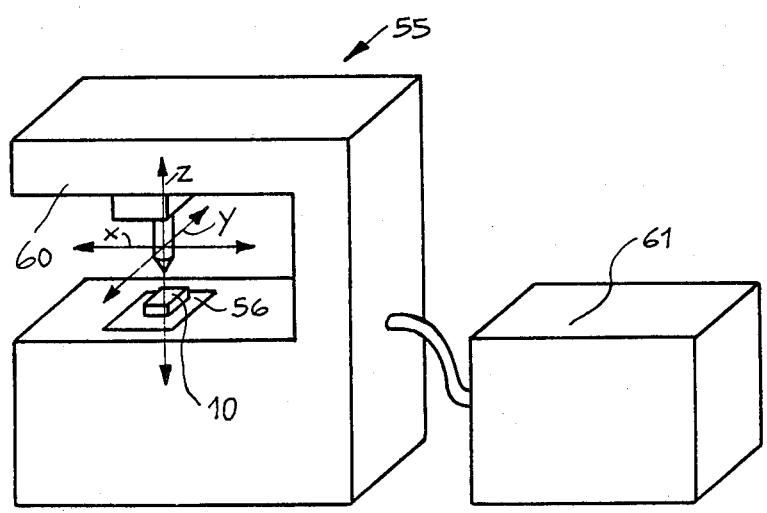
FIG. 6 is a diagrammatic perspective view of a laser apparatus for carrying out certain manufacturing stages of the optical transducer according to the invention.

When assembly is complete, the transducer 10 is mounted on a bed 56 of the laser apparatus 55 (FIGS. 6 and 2), the bed comprising a rotating shaft 56 for driving the disc 13. The transducer is mounted with the aid of suitable gauges to ensure that, relative to the bed 56, the plate 21 is positioned with narrow tolerance limits (a few hundredths of a millimeter) in the vertical plane (z axis) and to within a few tenths of a millimeter in the working plane (x-y axes). This positioning, after initial focusing of the laser beam (at reduced power) emitted by a generator 60, is sufficient for a data processor 61 to mutually position the laser beam and structure 56 such that the beam strikes a predetermined limited zone of the plate 21.

The zone struck by the laser beam is located adjacent to one resistor 64 of the board 21 which is connected by conductors 62 and 63 to two terminals 65 and 66 supplied by the laser apparatus control circuit of the processor 61 for fine positioning between the laser beam and plate 21 (edge finding). The conductor 63 is of small size in the zone adjacent to the resistor 64, and is configured in proximity to one edge of the plate 21 as an L, the arms of which are parallel to the x-y axes of the apparatus after initial positioning.

Figure 3:
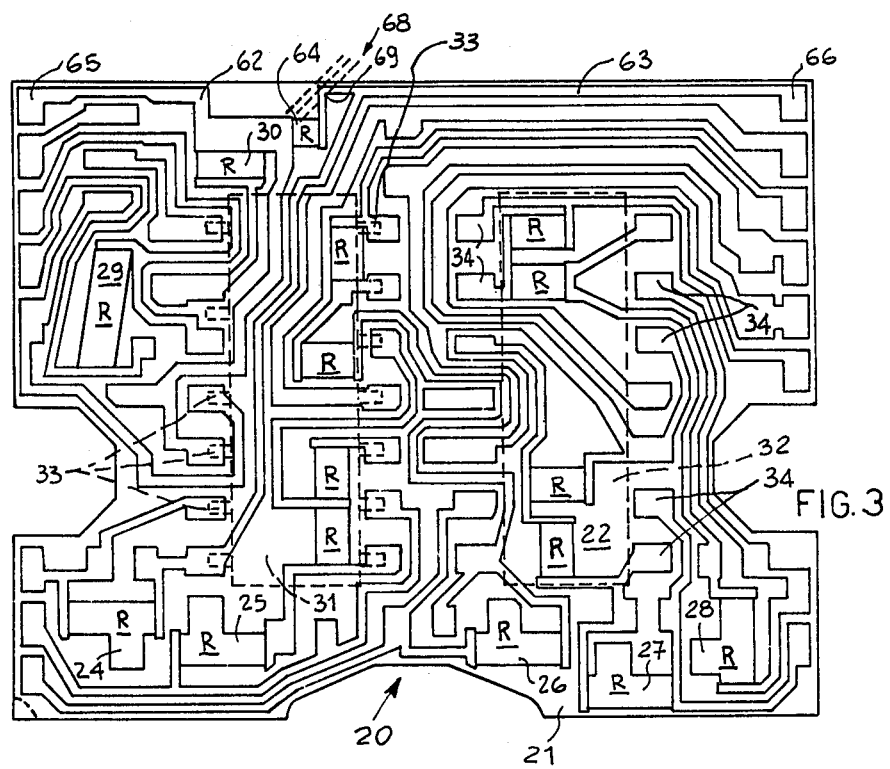
FIG. 3 is an enlarged view of a detail of the transducer of FIG. 1.

After being started by the operator, the processor 61 activates the generator 60 at full power, and causes a series of mutual displacements to be made at 45° to the x-y axes within the initial positioning zone, with an advancement pitch of the order of a few hundredths of a millimeter, in order to scan the zone indicated with dashed lines by 68 in FIG. 3.

When the laser beam encounters the conductor 63, it cuts it by burning. The control circuit constantly checks the electrical continuity between the terminals 65 and 66 of the plate 21 in accordance with the relative position of the laser beam to the plate 21 in the x-y plane. When the cut reaches the internal vertex 69 of the conductor 63, electrical continuity is interrupted. The processor 61 then determines the instantaneous position of the laser beam relative to the plate, memorises it as the initial zero position and deactivates the generator 60. Functional trimming of the resistors 24 to 29 is then carried out automatically by the processor 61, without the need for any other adjustment, because of the high accuracy and dimensional stability of the plate 21 and of the resistors R deposited thereon.

What I claim is:

1. An optical transducer for determining the angular position of a rotatable member relative to a fixed structure, comprising a disc connected to said rotatable member and provided with a plurality of radial light transmitting elements alternate to light non-transmitting elements, a housing connected to said fixed structure and inside which said disc is lodged, a light emitting element mounted on said housing for illuminating said radial elements, a plurality of photocells arranged on said housing to detect the passage of light through said light transmitting elements, and an electronic circuit connected to said photocells for generating output signals indicative of the angular position of said rotatable disc with respect to said housing, wherein said circuit comprises active and passive components, electrical interconnections between said components, at least one trimming resistor for regulating said output signals within predetermined limits, a ceramic plate mounted on said housing and having an external flat surface on which said electrical interconnections and said trimming resistor are deposited, and an edge reference element deposited on said ceramic plate at a predetermined and exact distance from said trimming resistor, for causing the trimming of said trimming resistor to be operated by means of a calibrating apparatus including a laser beam automatically founding said edge reference element and automatically positionable on said trimming resistor starting from said edge reference element.

2. An optical transducer according to claim 1, wherein said edge reference element comprises a conductor deposited on said flat surface of the ceramic plate and having two terminals and an intermediate microsection which can be trimmed to interrupt the electrical connection between said two terminals.

3. An optical transducer according to claim 1, wherein said plurality of photocells are mounted on said ceramic plate at the opposed side with respect to said external flat surface.

4. An optical transducer according to claim 3, wherein said plurality of photocells are integrated into a silicon substrate preassembled in a plastic support frame and connected to said electronic circuit.

5. An optical transducer according to claim 4, wherein said support frame incorporates a plurality of conductive elements, each one of which having a first terminal connected with a corresponding one of said plurality of photocells, and a second terminal connected to said electronic circuit.

6. An optical transducer for determining the position of a movable member relative to a fixed structure, comprising a light emitting element, a plurality of photocells opposed to said light emitting element with respect to said movable member for generating signals indicative of the movement of said member relative to said fixed structure, and an electronic circuit for processing said signals, said plurality of photocells being integrated into a silicon substrate mounted in an assembly which comprise a plastic support frame which incorporates a plurality of conductive elements each one having a first terminal connected with a corresponding one of said photocells and a second terminal connected to said electronic circuit, further comprising a ceramic plate having two major surfaces parallel therebetween, wherein said electronic circuit comprises at least one integrated circuit, and wherein said integrated circuit is supported on one of said major surfaces of said ceramic plate, and said plurality of photocells is supported by the other of said major surfaces of said ceramic plate.

* * * * *